(12) United States Patent
Nakamura et al.

(10) Patent No.: US 7,667,182 B2
(45) Date of Patent: *Feb. 23, 2010

(54) SEMICONDUCTOR PHOTODETECTOR WITH CONVERGING STRUCTURE ON LIGHT RECEIVING SURFACE SEALED WITH OPTICAL TRANSMITTING RESIN CONTAINING MICRO PARTICLES

(75) Inventors: Daisuke Nakamura, Fujimino (JP); Haruo Fukawa, Fujimino (JP); Fumio Takamura, Fujimino (JP)

(73) Assignee: New Japan Radio Co., Ltd., Tokyo-to (JP)

( * ) Notice: Subject to any disclaimer, the term of this patent is extended or adjusted under 35 U.S.C. 154(b) by 679 days.

This patent is subject to a terminal disclaimer.

(21) Appl. No.: 11/447,006

(22) Filed: Jun. 6, 2006

(65) Prior Publication Data

US 2007/0170562 A1    Jul. 26, 2007

(30) Foreign Application Priority Data

Jan. 26, 2006    (JP)    ............................. 2006-017413

(51) Int. Cl.
   *H01L 23/29*    (2006.01)
(52) U.S. Cl. .................... 250/214.1; 257/791
(58) Field of Classification Search ............. 250/214.1, 250/214 R; 257/791
   See application file for complete search history.

(56) References Cited

U.S. PATENT DOCUMENTS 5,623,143 A * 4/1997 Takamatsu ............... 250/214.1
2006/0157727 A1* 7/2006 Takamura et al. ........... 257/100

FOREIGN PATENT DOCUMENTS

JP       9-15044       1/1997
JP       2005-12885    1/2005

* cited by examiner

*Primary Examiner*—Seung C Sohn
(74) *Attorney, Agent, or Firm*—Antonelli, Terry, Stout & Kraus, LLP.

(57) ABSTRACT

A semiconductor photodetector which can obtain spectral sensitivity characteristics close to relative luminous characteristics compared to a conventional semiconductor photodetector is obtained at low cost. The semiconductor photodetector includes a semiconductor light receiving element having high spectral sensitivity in wavelengths in a range from approximately 400 nm to 1,100 nm and an optical transmitting resin where micro particles is dispersed in a transparent resin with an amount which can be obtain photocurrent from the semiconductor light receiving element by transmitting light in wavelengths in the visible light region while blocking light in wavelengths in the infrared region. The semiconductor photodetector further includes a converging structure on a light receiving surface of the semiconductor photodetector.

15 Claims, 16 Drawing Sheets

SPECTRAL SENSITIVITY CHARACTERISTICS OF CdS

STANDARD RELATIVE
LUMINOUS CHARACTERISTICS

A = epoxy resin 10 : suspension 0.15
B = epoxy resin 10 : suspension 0.30
C = epoxy resin 10 : suspension 0.50

SEMICONDUCTOR PHOTODETECTOR WITH CONVERGING STRUCTURE ON LIGHT RECEIVING SURFACE SEALED WITH OPTICAL TRANSMITTING RESIN CONTAINING MICRO PARTICLES

BACKGROUND OF THE INVENTION

The present invention relates to a semiconductor photodetector including a semiconductor light receiving element having spectral sensitivity to light in wavelengths from the visible light region to the infrared region and an optical transmitting resin where micro particles which block light in wavelengths in the infrared region are dispersed in a transparent resin, and having spectral sensitivity to light in wavelengths in the visible light region.

As an illumination sensor which is a type of a photodetector in the visible light region, a CdS cell having spectral sensitivity characteristics as shown in FIG. 11 has been widely used. However, since cadmium is high in environmental burdens and falls under a controlled substance by RohS command of EU, cadmium will be prohibited to use within EU from July 2006. As a replacement of cadmium, photodetectors formed from silicon have attempted to be used. In order to compose an illumination sensor with silicon, spectral sensitivity of silicon needs to be coordinated with relative luminous characteristics which are sensitivity of human eyes. FIG. 12 shows spectral sensitivity characteristics of a silicon phototransistor. From FIG. 12, it is grasped that the silicon phototransistor has sensitivity to light in wavelengths of at least 800 nm (infrared region). On the other hand, human eyes do not have sensitivity to the light in the infrared region as shown in standard relative luminous characteristics in FIG. 13.

From the above-mentioned reason, a conventional photodetector of such type is provided with a filter composed of multilayer film in which an oxide silicon ($SiO_2$) film and a titanium oxide ($TiO_2$) film are alternatively laminated at a light receiving surface side to lower spectral sensitivity of the infrared region within the spectral sensitivity of silicon, to thereby approximate to relative luminous characteristics (FIG. 13) (see, for example Japanese Unexamined Patent Publication No. 15044/1997).

However, formation of the multilayer film in which an oxide silicon film and a titanium oxide film are alternatively laminated is a troublesome task in terms of time and processes, and results in high cost. Therefore, the applicant of the present invention has been proposed a semiconductor photodetector having spectral sensitivity characteristics close to relative luminous characteristics at low cost (Japanese Unexamined Patent Publication No. 12885/2005).

The semiconductor having been previously proposed by the applicant of the present invention is shown in FIG. 14. In FIG. 14, numeral 1 is a substrate, 2 is a semiconductor light receiving element having high spectral sensitivity in wavelengths from at least the visible light region to infrared region, 3 is a metal wire, and 4 is an optical transmitting resin in which the optical transmitting resin is boride of one or more elements selected from La, Pr, Nd, Ce, Y, Ti, Zr, Hf, V, Nb, Ta, Cr, Mo or W and is formed by dispersing micro particles whose particle diameter is not more than approximately 100 nm in a transparent resin. By sealing at least the light receiving surface of the semiconductor light receiving element 2 with the optical transmitting resin 4 in which micro particles are dispersed, the micro particles attenuate the light in wavelengths of the infrared region of the incident light to achieve spectral sensitivity characteristics which close to relative luminous characteristics.

However, in the case of dispersing micro particles with the quantity for blocking light in the infrared region in a transparent resin, the semiconductor photodetector previously proposed by the applicant of the present invention also blocks light in the visible light region when the quantity of micro particle is too much. Therefore, output of a semiconductor light receiving element (photocurrent) becomes small.

In specific, FIG. 15 shows changes of transmissivity when the quantity of micro particles (lanthanum boride) to be dispersed in a transparent resin (epoxy resin) is changed. The optical transmitting resin is prepared by mixing a suspension in which micro particles are suspended in an organic solvent such as toluene with the transparent resin (epoxy resin). Therefore, the quantity of micro particles to be dispersed is increased with the increased quantity of suspension. From the figure, it is grasped that light in the visible light region is correspondingly blocked when the transmissivity of light in the infrared region decreased. It has been also confirmed that light in the visible light region is blocked together with the decrease in transmissivity of light in the infrared region in the case the thickness of the resin is increased.

FIG. 16 shows the relative transmissivity when the peak value of transmissivity of an optical transmitting resin with a thickness of 1 mm which includes 2.0 wt. % of suspension of lanthanum boride is 100%. Compared with the relative luminous sensitivity, the optical transmitting resin transmits light in the infrared region.

When a semiconductor photodetector is formed by using such optical transmitting resin, no problem occurs by fluorescent light which does not include light in wavelengths of the infrared region in which light receiving sensitivity of the semiconductor light receiving element is high. However, photocurrent may be generated by incidence of light in the infrared region by sunlight which includes light in wavelengths in the infrared region.

Accordingly, when the quantity of micro particles is increased enough to substantially block light in the infrared region, light in wavelengths of the visible light region is blocked and photocurrent of a semiconductor light receiving element (output signal) becomes significantly small. In such a case, there is a need for additionally providing an amplifying means for an output signal.

There has been a problem that cost is increased in the case of additionally providing such amplifying means for an output signal. On the other hand, there has been also a problem that relative luminous characteristics cannot be obtained when a semiconductor photodetector is formed to transmit light in the infrared region to some extent. An object of the present invention is to resolve the above-mentioned problems and to provide a semiconductor photodetector which can achieve spectral sensitivity characteristics close to relative luminous characteristics compared to a conventional semiconductor photodetector at low cost.

SUMMARY OF THE INVENTION

A semiconductor photodetector of the invention includes a semiconductor light receiving element having spectral sensitivity in wavelengths from at least a visible light region to infrared region and an optical transmitting resin for sealing at least a light receiving surface of the semiconductor light receiving element formed from boride of one or more elements selected from La, Pr, Nd, Ce, Y, Ti, Zr, Hf, V, Nb, Ta, Cr, Mo or W or in stead of the boride, or in addition to the boride, ruthenium oxide and/or iridium oxide and in which micro particles of the boride and oxide whose particle diameter is not more than 100 nm are dispersed, wherein the optical transmitting resin is dispersed with an amount of the micro particles by which photocurrent can be obtained through the semiconductor light receiving element by transmitting light in wavelengths in the visible light region while blocking light in wavelengths in the infrared region, and a converging structure is provided on the light receiving surface of the semiconductor light receiving element.

Furthermore, according to the present invention the micro particles are dispersed in the transparent resin in such a manner that relative transmissivity of light in wavelengths in the infrared region to be blocked is not more than 1.5% compared to a peak value of transmissivity of light in wavelengths in the visible light region which transmits the optical transmitting resin.

Furthermore, according to the present invention a concentration of the micro particles included in the transparent resin and thickness of the optical transmitting resin are determined in such a manner that relative transmissivity of light in wavelengths in the infrared region to be blocked is not more than 1.5% compared to a peak value of transmissivity of light in wavelengths in the visible right region which transmits the optical transmitting resin.

Furthermore, according to the present invention the micro particles are dispersed in the transparent resin in such a manner that relative transmissivity of light in wavelengths in the infrared region to be blocked is not more than 5% compared to a peak value of transmissivity of light in wavelengths in the visible light region which transmits the optical transmitting resin.

Furthermore, according to the present invention a concentration of the micro particles included in the transparent resin and thickness of the optical transmitting resin is determined in such a manner that relative transmissivity of light in wavelengths in the infrared region to be blocked is not more than 5% compared to a peak value of transmissivity of light in wavelengths in the visible right region which transmits the optical transmitting resin.

Furthermore, according to the present invention the converging structure is integrally formed with the optical transmitting resin for sealing the light receiving surface by a resin which transmits light in wavelengths in at least visible light region.

Furthermore, according to the present invention the converging structure is integrally formed with the optical transmitting resin for sealing the light receiving surface by the optical transmitting resin in which the micro particles are dispersed.

According to the present invention, a semiconductor photodetector which can obtain spectral sensitivity characteristics close to relative luminous characteristics is realized by dispersing micro particles such as lanthanum boride with the quantity which substantially blocks light in the infrared region in a transparent resin. Furthermore, the semiconductor photodetector may have a structure to increase the amount of light to be received on a light receiving surface of a semiconductor light receiving element by a converging structure for the purpose of compensating decreased photocurrent which is outputted from the semiconductor light receiving element due to a block of light in the visible light region. Therefore, the semiconductor photodetector which is suitable for an illumination sensor can be formed without being provided with an amplifying means.

In particular, a semiconductor photodetector substantially corresponding to relative luminous characteristics can be formed by dispersing the quantity of micro particles with which relative transmissivity of light desired to be blocked is to the degree of 1.5% compared to the peak value of transmissivity of light in the visible light region. A predetermined quantity of micro particles to be dispersed is readily obtained by adjusting the concentration of micro particles dispersed in the transparent resin and the thickness of the optical transmitting resin.

The converging structure may be formed from an optical transmitting resin, and can be readily and inexpensively provided by simultaneously forming with a sealing resin. In particular, when a converging structure is formed from an optical transmitting resin in which micro particles are dispersed, the converging structure itself performs a function of blocking light in the infrared region. The converging structure, therefore, does not prevent a compact structure.

Since the semiconductor photodetector of the present invention has spectral sensitivity substantially corresponding to that of human eyes, the semiconductor photodetector of the present invention may be suitably used as an illumination sensor for controlling a liquid crystal backlight of such as portable devices (such as cellular phones and PDA) and personal computers, for controlling automatic lighting of such as house light and security light, for controlling electric flash of cameras or the like.

DETAILED DESCRIPTION

Figure 10:
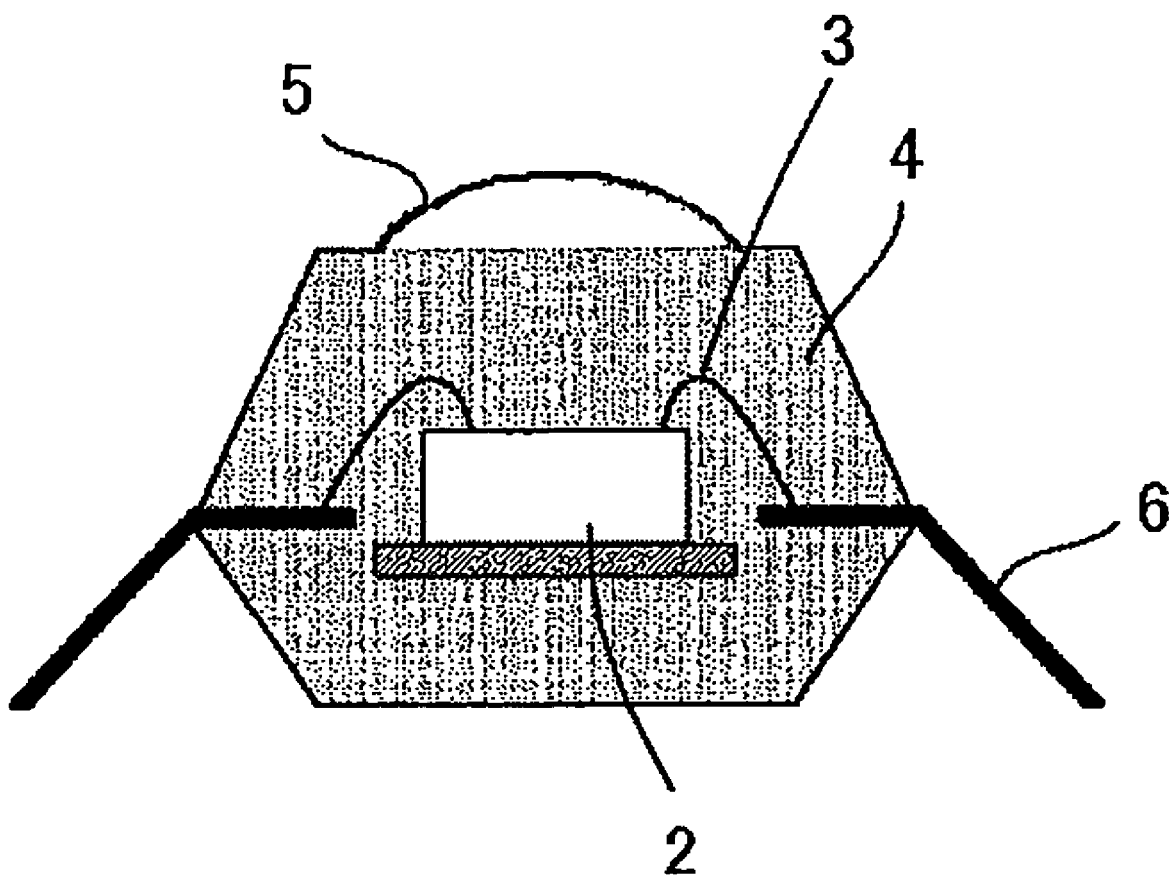
FIG. 10 is an explanatory diagram of a semiconductor photodetector according to another Example of the present invention.
Figure 11:
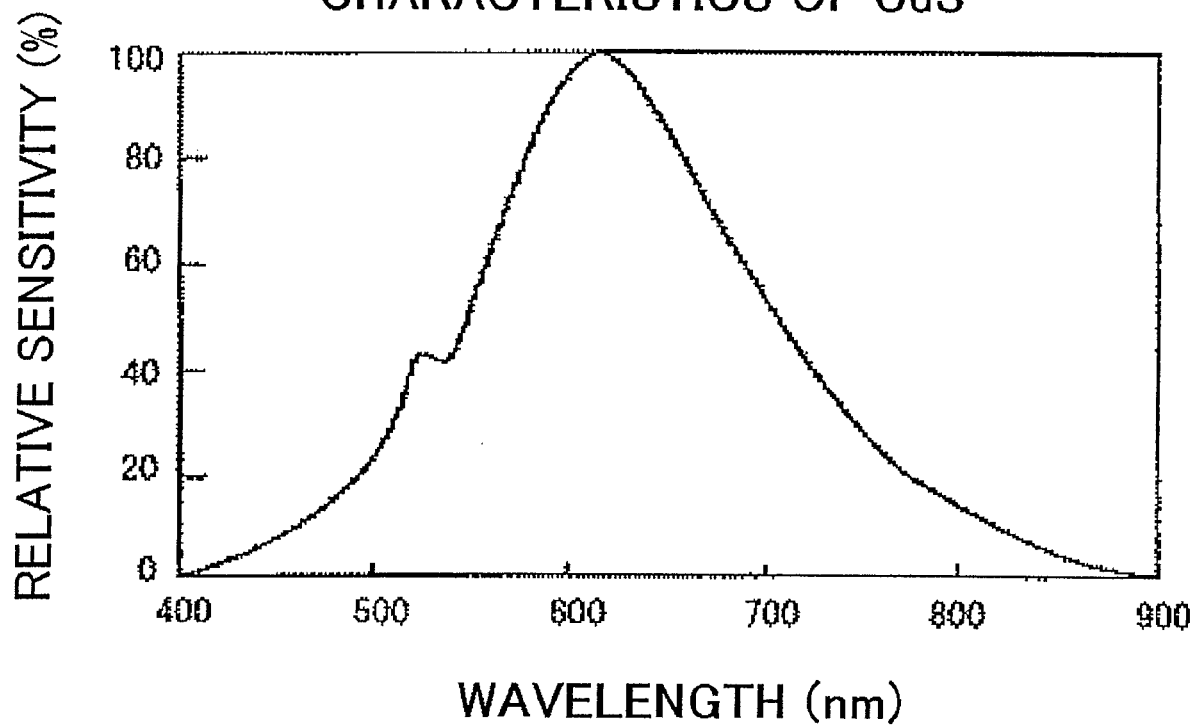
FIG. 11 is a diagram showing spectral sensitivity characteristics of CdS.
Figure 12:
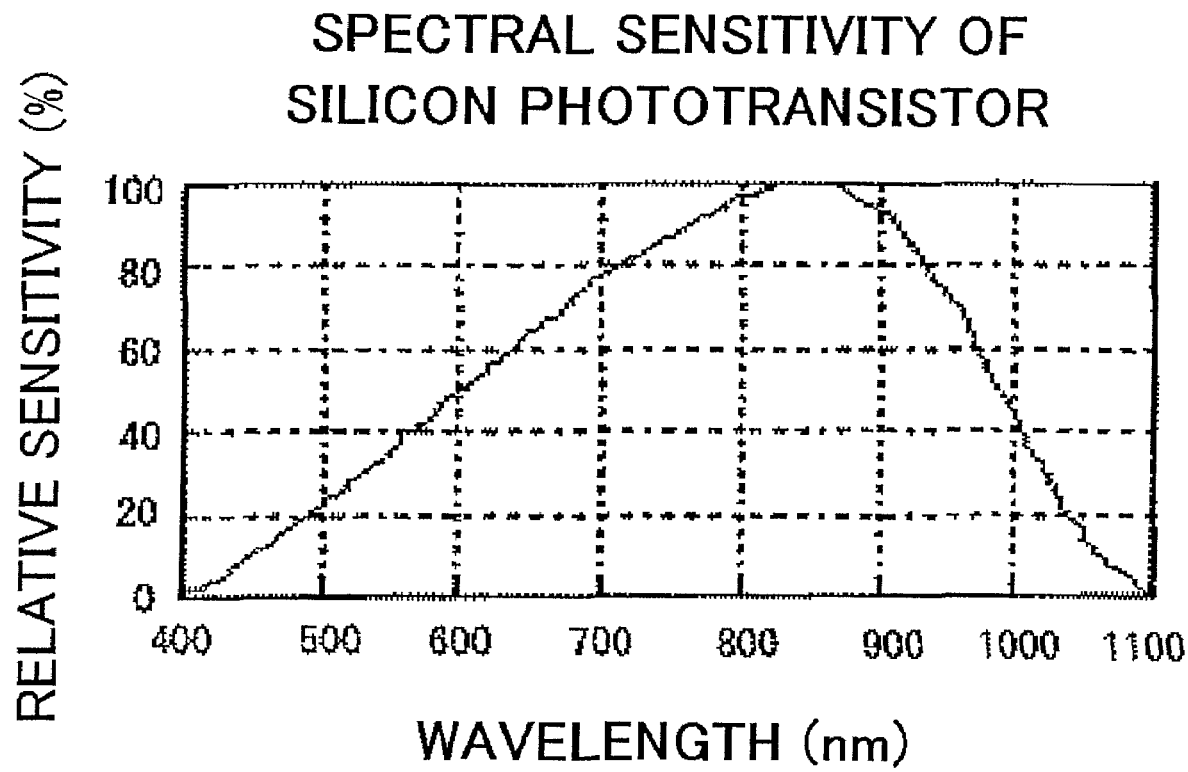
FIG. 12 is a diagram showing spectral sensitivity characteristics of a silicon phototransistor
Figure 13:
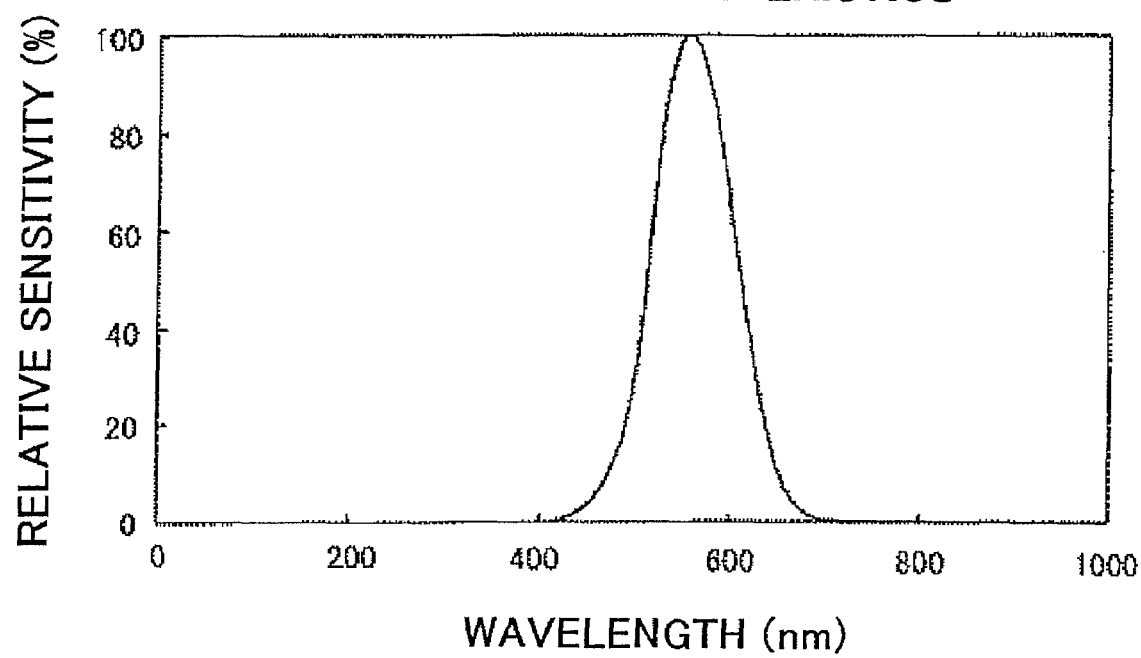
FIG. 13 is a diagram showing standard relative luminous characteristics.
Figure 14:
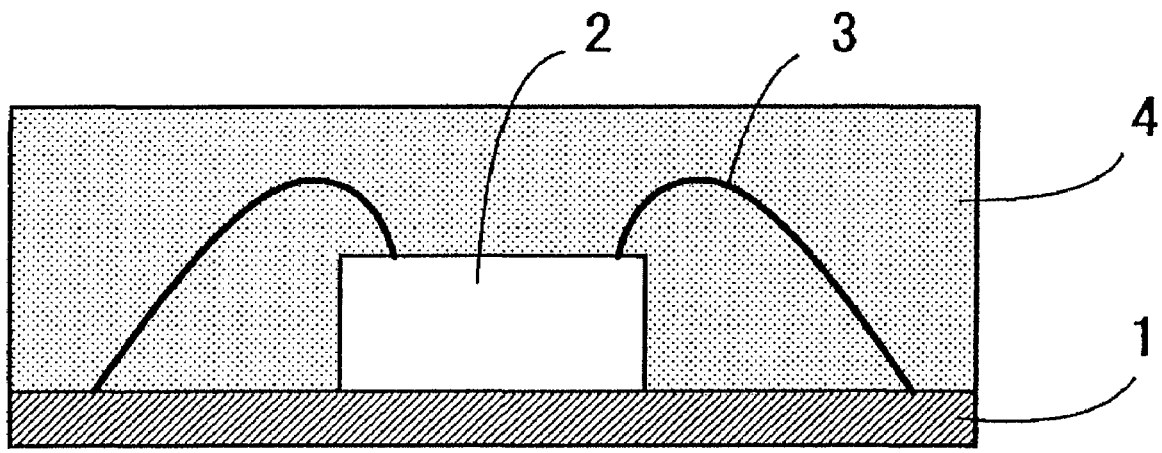
FIG. 14 is an explanatory diagram of a conventional semiconductor photodetector.
Figure 15:
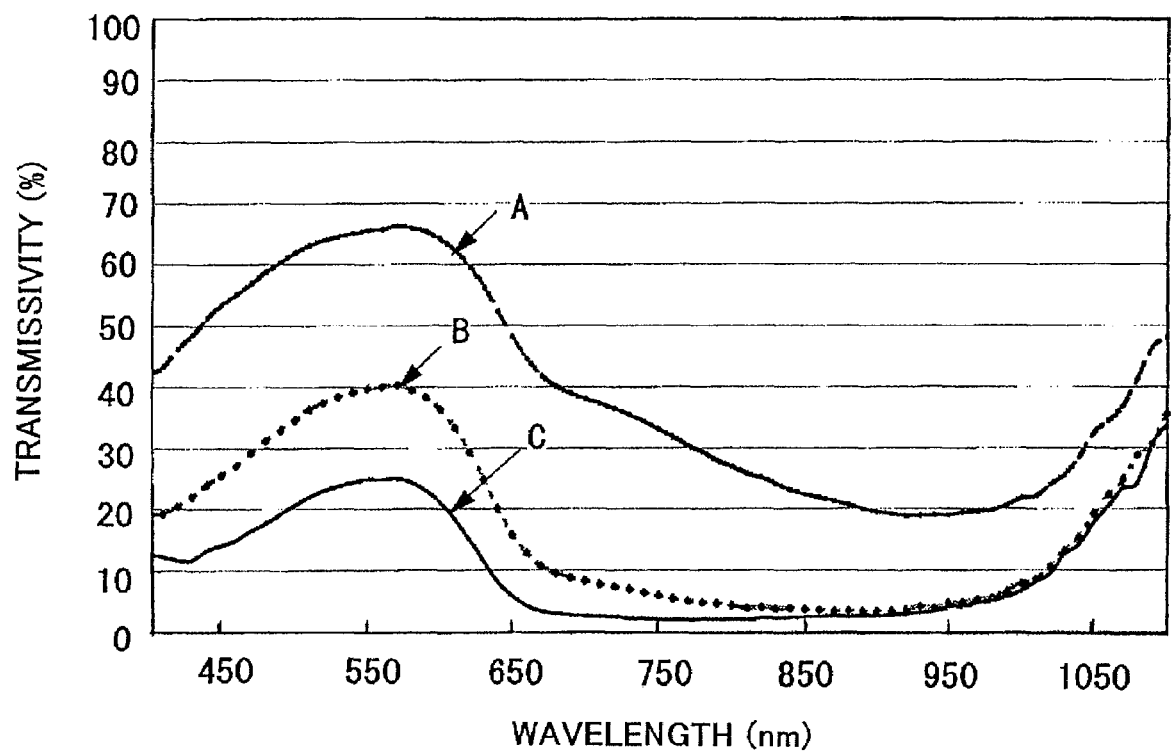
FIG. 15 is a characteristic diagram showing transmissivity of an epoxy resin in which micro particles are dispersed.
Figure 16:
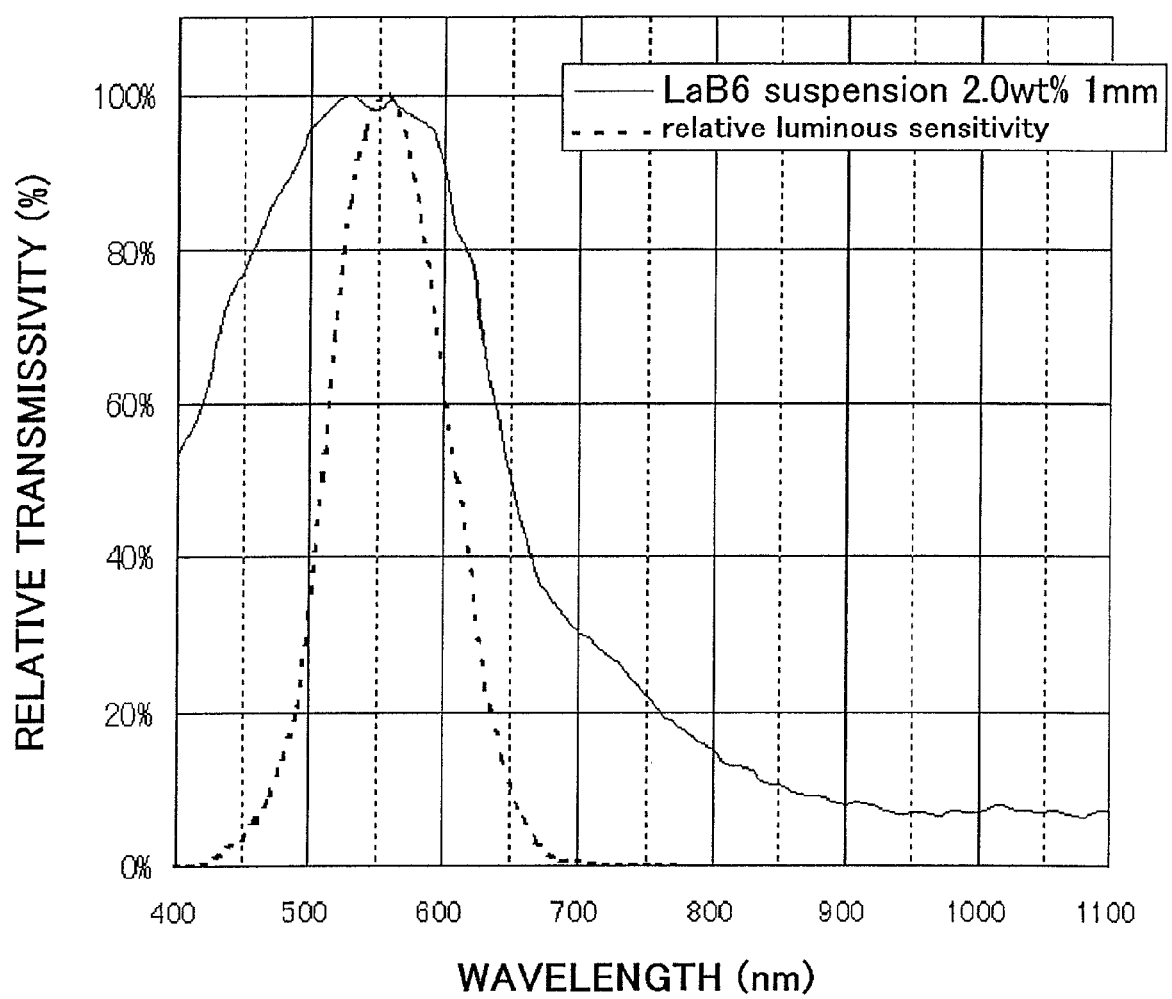
FIG. 16 is a characteristic diagram wherein relative transmissivity of an epoxy resin in which micro particles are dispersed is compared with relative luminous sensitivity.

In the present invention, a semiconductor light receiving element is composed of a silicon semiconductor or a compound semiconductor as gallium arsenide or, gallium phosphide, indium phosphide, and a material with high spectral sensitivity for light between at least the visible light region and the infrared region (a material having high spectral sensitivity in wavelengths in a range between 400 to 1,100 nm as shown in FIG. 10) is used. As an optical transmitting resin for sealing a light receiving surface of the semiconductor light receiving element, a transparent resin (for example an epoxy resin) in which micro particles of lanthanum boride ($LaB_6$) or particles of elements to be described below whose particle diameter is not more than 100 nm are dispersed is used.

A reason for selecting such as lanthanum boride is that it is a material with high light blocking characteristics for wavelengths in the infrared region compared to other metal oxide. With micro particles of the present invention, when fluorescent light or sunlight incidents inside an optical transmitting resin in which micro particles of such as lanthanum boride are dispersed and encounters the micro particles, electromagnetic waves at higher frequency than the frequency of plasma frequency pass through while electromagnetic waves at lower frequency are totally reflected due to the number of frequencies of free electrons generated by loose density of micro particles in lower than the plasma frequency. Lanthanum boride has blocking characteristics relative to wavelengths in the infrared region, since wavelengths of frequency causing total reflection are present in the infrared region.

A reason for selecting micro particles whose particle diameter is not more than 100 nm is to suppress visible light (wavelengths between 400 to 700 nm) to be reflected by scattering. In other words, when a particle diameter of a micro particle is less than the wavelengths of visible light, light scattering by the micro particle becomes mainly Rayleigh scattering. The scattering enlarges in proportion to the square of the particle volume, namely the sextuplicate of the particle diameter. Therefore, a smaller particle diameter results in a sharp reduction in scattering, thereby transparency relative to the visible light is increased. The transparency relative to visible light can be obtained by particle diameters less than ¼ of the wavelengths in visible light (approximately less than 100 nm).

As described above, micro particles of such as lanthanum boride have particular characteristics that block light in wavelengths in the infrared region and transmit light in the visible light region whose wavelengths are shorter than that of the infrared region when micro particles are dispersed in the transparent resin. In the present invention, the concentration of micro particles to be dispersed or the thickness of an optical transmitting resin is suitably determined such that a condition where light in wavelengths in the infrared region is blocked (preferably, relative transmissivity against the peak value of transmissivity in the visible light region is approximately not more than 1%) and light in wavelengths in the visible light region is transmitted is satisfied. Furthermore, the present invention is characterized in that the amount of light which incidents on a semiconductor light receiving element is increased by providing a converging structure such as a lens in order to compensate the decreased amount of light in the visible light region which is blocked by the micro particles.

The converging structure may be formed by a well-known converging structure. However, preferably the converging structure may have a structure which is integrally molded by a resin which transmits light in the visible light region on an optical transmitting resin for sealing a light receiving surface of a semiconductor photodetector. In particular, when a converging structure is formed by the optical transmitting resin of the present invention in which micro particles are dispersed, it is preferably since resin seal of the semiconductor photodetector and the converging structure are simultaneously formed and a compact structure of a semiconductor photodetector is maintained.

As micro particles dispersed in the transparent resin, boride micro particles of such as praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB$, $CrB_2$), molybdenum boride ($MoB_2$, $Mo_2B_5$, $MoB$) or tungsten boride ($W_2B_5$) are typically used besides the above-mentioned lanthanum boride ($LaB_6$), and one or two or more of those can be used.

Furthermore, instead of those boride micro particles or in addition to those boride micro particles, ruthenium oxide micro particles or iridium oxide micro particles may be added. In specific, micro particles of ruthenium dioxide ($RuO_2$), lead ruthenate ($Pb_2Ru_2O_{6.5}$), bismuth ruthenate ($Bi_2Ru_2O_7$), iridium dioxide ($IrO_2$), bismuth iridate ($Bi_2Ir_2O_7$) and lead iridate ($Pb_2Ir_2O_{6.5}$) may be used. Ruthenium oxide or iridium oxide are stable oxide, have a large amount of free electrons and are high in blocking characteristics of the infrared region.

The above-described boride micro particles and oxide micro particles are also superior in heat resistance. Therefore, degradation of blocking characteristics of infrared light is not recognized in the case heat is applied for reflow soldering which is required to mount a semiconductor photodetector.

The micro particles are suspended in an organic solvent such as toluene and dispersed in a resin for sealing. A surface active agent or coupling agent may be added as required at this time. The amount of micro particles included in a transparent resin is determined in accordance with the thickness of a resin formed on the surface of the light receiving element or required blocking characteristics of the infrared region and transmitting characteristics of the visible light region. An example of the present invention will now be described below.

EXAMPLE 1

Figure 1:
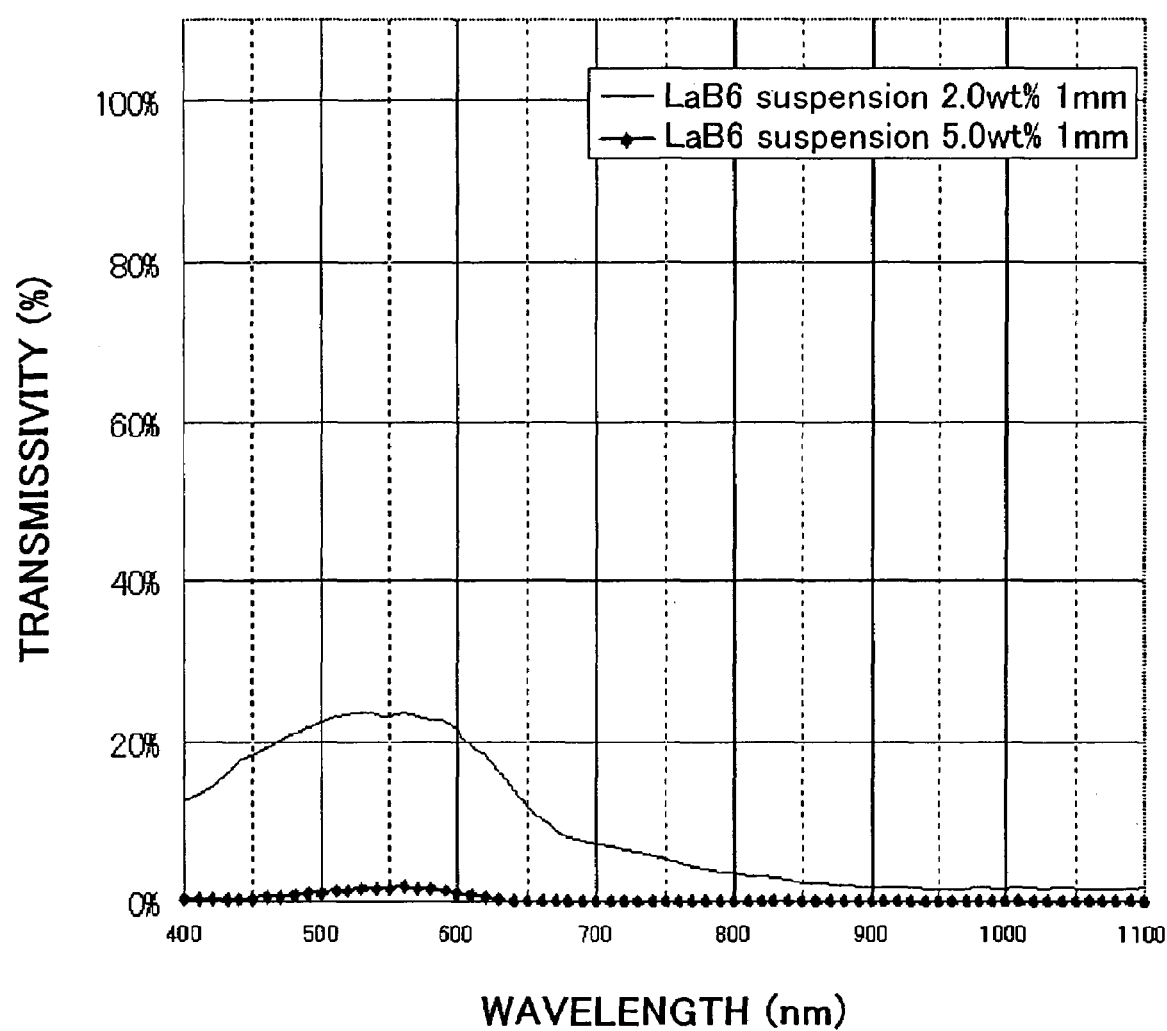
FIG. 1 is a characteristic diagram of transmissivity of an optical transmitting resin used in the present invention.
Figure 2:
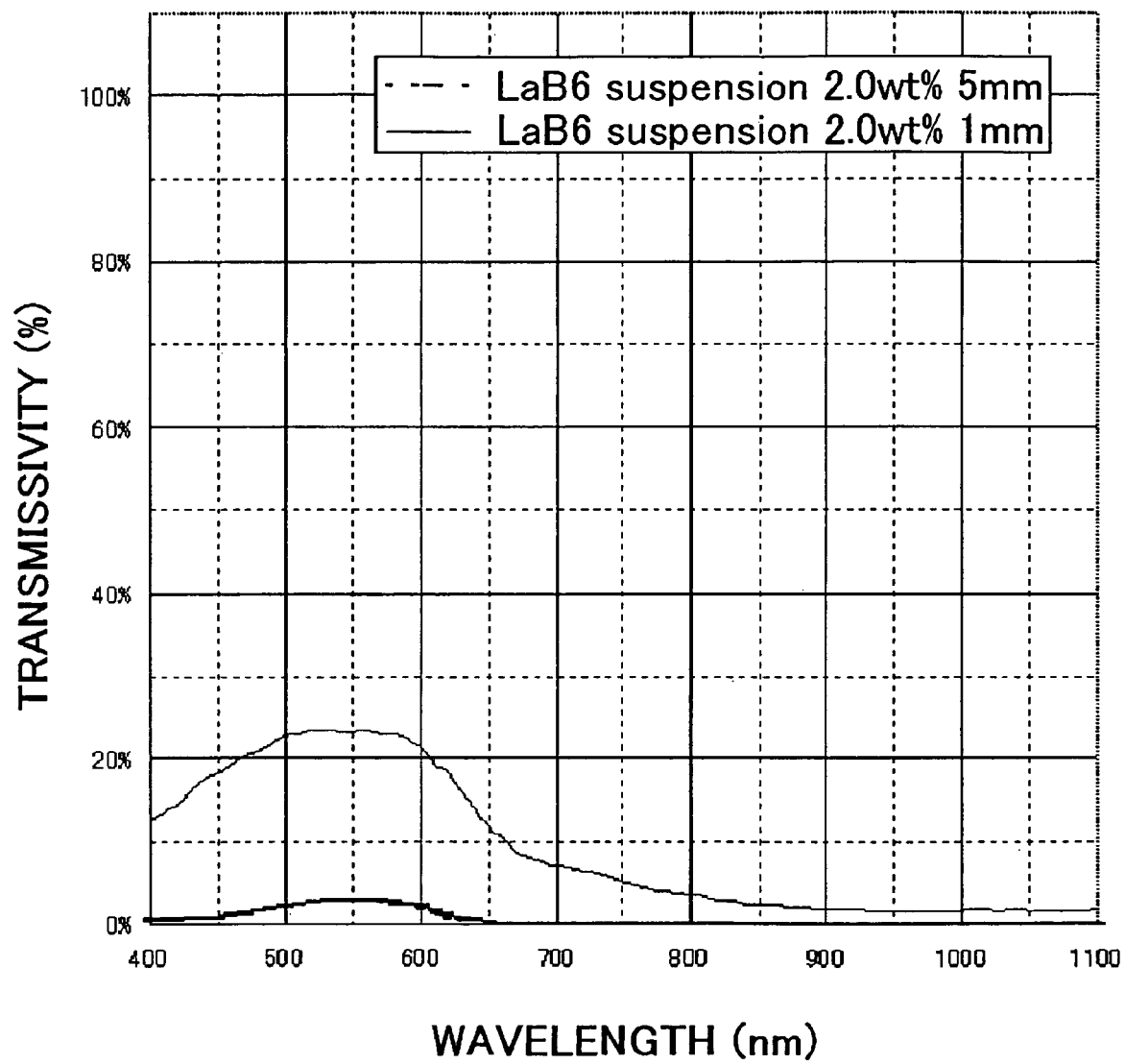
FIG. 2 is a characteristic diagram of transmissivity of another optical transmitting resin used in the present invention.

FIG. 1 is an explanatory drawing of an optical transmitting resin used in the present invention. FIG. 1 shows transmissivity of an optical transmitting resin in which 5.0% by weight of a suspension including 1.85% by weight of micro particles of lanthanum boride ($LaB_6$) is dispersed in a transparent resin (epoxy resin) and whose thickness is 1 mm. For the purpose of comparison, transmissivity of an optical transmitting resin with 2.0% by weight of a suspension including 1.85% by weight of micro particles of lanthanum boride ($LaB_6$) and the thickness of 1 mm is shown. FIG. 2 shows transmissivity of an optical transmitting resin in which 2.0% by weight of a suspension including 1.85% by weight of micro particles of lanthanum boride ($LaB_6$) is dispersed in a transparent resin and whose thickness is 5 mm. FIG. 2 also shows transmissivity of a conventional optical transmitting resin for the purpose of comparison. From FIGS. 1 and 2, it is grasped that only visible light is transmitted while light in wavelengths in the infrared region is blocked by increasing the concentration of micro particles dispersed in the optical transmitting resin or by increasing the thickness of the optical transmitting resin. In FIG. 1, the transmissivity in the infrared region is for example 0.0116% (800 nm) while the peak value of the visible light region is 1.74% (560 nm). Therefore, the relative transmissivity in the infrared region shown in FIG. 1 is only 0.67% relative to the peak value of the visible light region. In FIG. 2, the transmissivity in the infrared region is for example 0.0298% (800 nm) while the peak value of the visible light region is 2.91% (560 nm). Therefore, the relative transmissivity in the infrared region shown in FIG. 2 is 1.02 % relative to the peak value of the visible light region.

Figure 3:
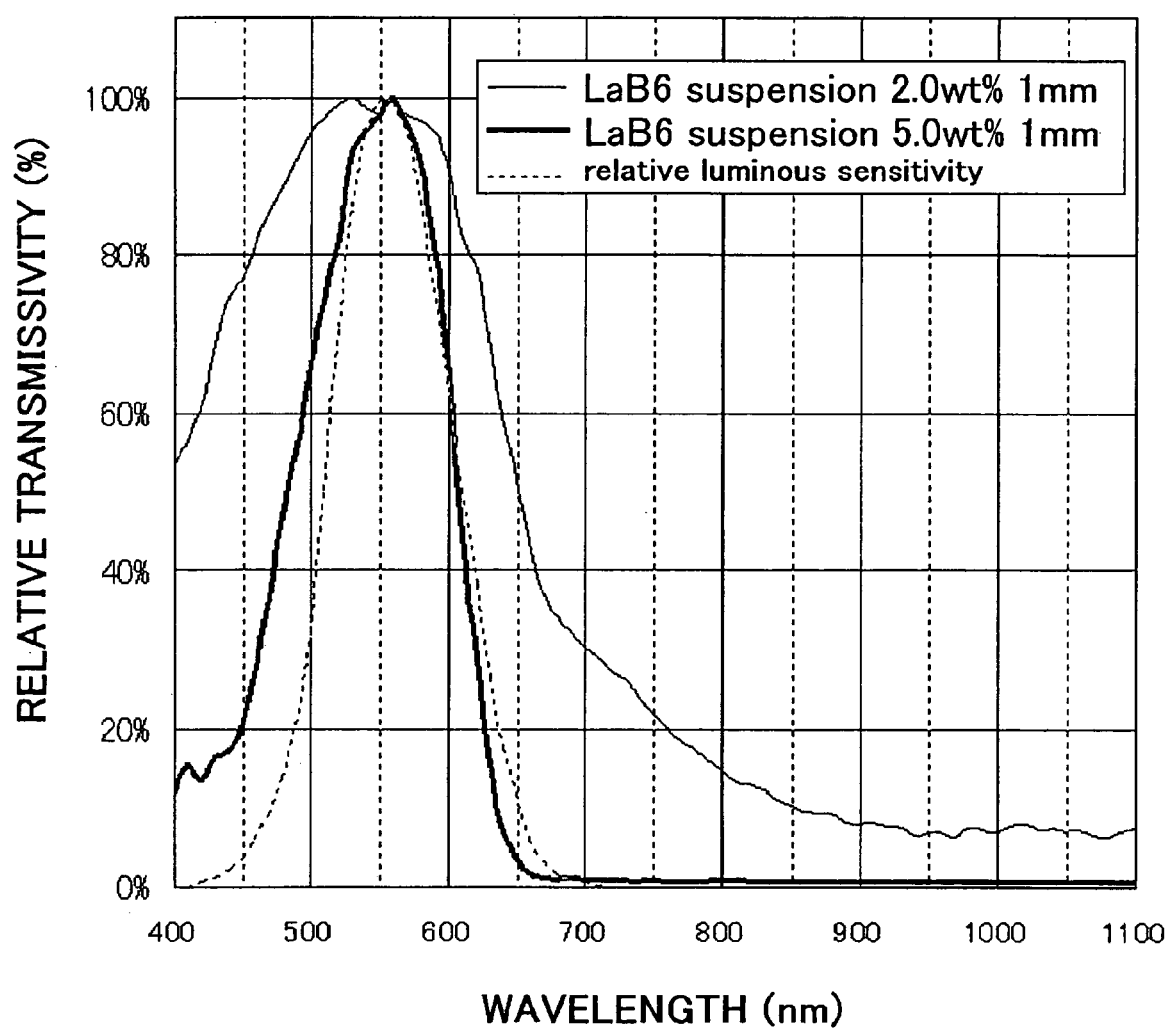
FIG. 3 is a characteristic diagram wherein relative transmissivity of an optical transmitting resin used in the present invention is compared with relative luminous sensitivity.

FIG. 3 shows relative transmissivity in which the peak value of the transmissivity shown in FIG. 1 is 100%. The relative transmissivity of the optical transmitting resin used in the present invention is shown by a heavy solid line. For the purpose of comparison, the relative transmissivity for the transmissivity of the optical transmitting resin with 1 mm thickenss wherein 2.0% by weight of a suspension including 1.85% by weight of lanthanum boride which slightly transmits light in wavelengths in the infrared region is dispersed is shown by a thin solid line and the relative luminous sensitivity of the optical resin is shown by a dashed line. As shown in FIG. 3, the relative transmissivity in the present invention is remarkably close to the relative luminous sensitivity. It should be noted that the relative transmissivity in the vicinity of 400 nm does not correspond to the relative luminous sensitivity in FIG. 3. However, since the sensitivity of the semiconductor light receiving element is remarkably low in this region, the relative transmissivity may substantially correspond to the relative luminous sensitivity, thus no problem occurs.

Figure 4:
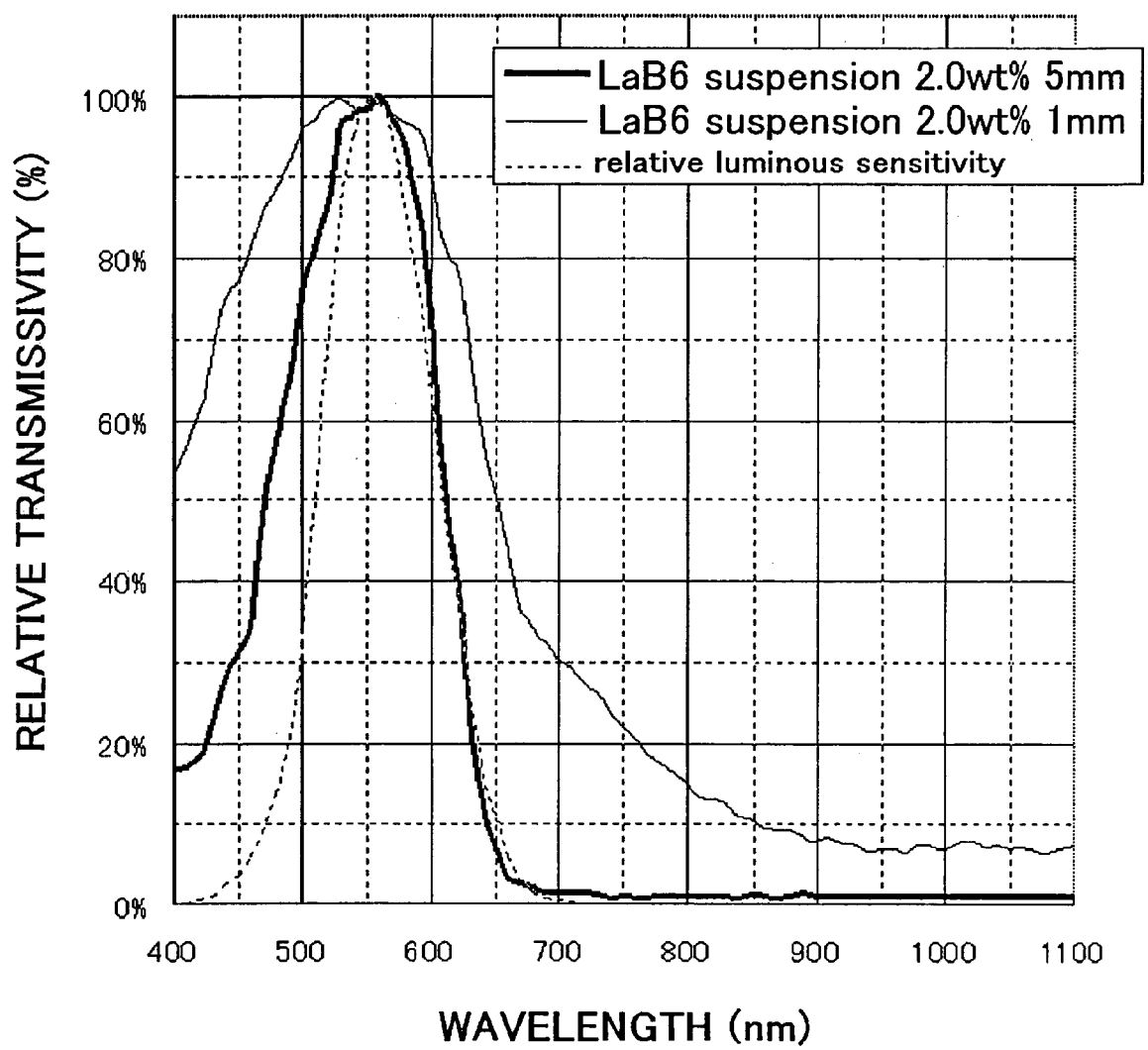
FIG. 4 is a characteristic diagram wherein relative transmissivity of another optical transmitting resin used in the present invention is compared with relative luminous sensitivity.

In the similar manner, FIG. 4 shows the relative transmissivity in which the peak value of the transmissivity shown in FIG. 2 is 100%. The relative transmissivity of the optical transmitting resin used in the present invention is shown by a heavy solid line. For the purpose of comparison, the relative transmissivity for the transmissivity of the optical transmitting resin with 1 mm thickenss wherein 2.0 % by weight of a suspension including 1.85 % by weight of lanthanum boride which slightly transmits light in wavelengths in the infrared region is dispersed is shown by a thin solid line and the relative luminous sensitivity of the optical resin is shown by a dashed line. As shown in FIG. 4, the relative transmissivity in the present invention is extremely close to the relative luminous sensitivity. It should be noted that the relative transmissivity in the vicinity of 400 nm does not correspond to the relative luminous sensitivity in FIG. 4. However, since the sensitivity of the semiconductor light receiving element is remarkably low in this region, the relative transmissivity may substantially correspond to the relative luminous sensitivity, thus no problem occurs.

When FIGS. 3 and 4 are compared, the relative transmissivity in the infrared region shown in FIG. 4 is slightly larger than that in FIG. 3. However, no problem occurs with this extent of difference. Preferably, characteristics which substantially correspond to the relative luminous sensitivity is obtained when the relative transmissivity is not more than 1.5% relative to the peak value of visible light in a wavelength region desired to be blocked. Furthermore, it is confirmed that no problem occurs when the relative transmissivity is not more than 5.0%.

In this manner, characteristics which is remarkably close to the relative luminous sensitivity may be obtained by increasing the concentration of micro particles dispersed in the transparent resin or by increasing the thickness of the optical transmitting resin such that even small amount of light in wavelengths in the visible light region is transmitted while blocking light in wavelengths in the infrared region.

In the case the above-mentioned optical transmitting resin is only used, the amount of light which incidents on the semiconductor light receiving element is small, and an amplifying means needs to be provided. In the present invention, the amount of light which incidents on the semiconductor light receiving element is increased by forming a converging structure, a lens structure in specific.

Figure 5:
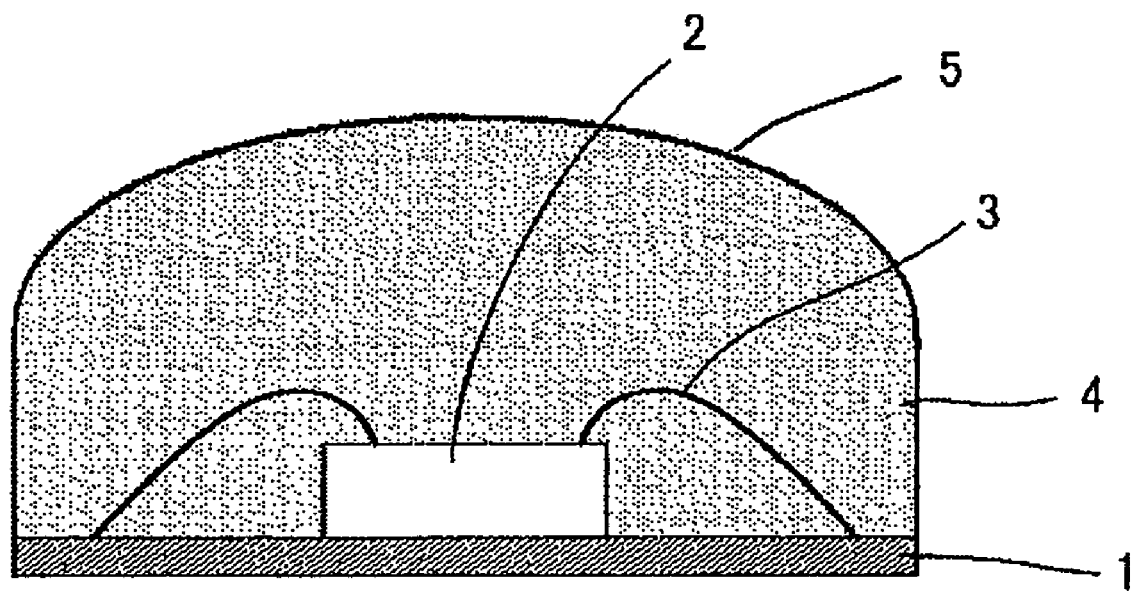
FIG. 5 is an explanatory diagram of a semiconductor photodetector according to Example 1 of the present invention.

A sectional view of the semiconductor photodetector according to the present invention is shown in FIG. 5 as an example. In FIG. 5, numeral 1 is a substrate, 2 is a light receiving element, 3 is a metal wire, 4 is an optical transmitting resin in which micro particles such as lanthanum boride are dispersed and 5 is a converging structure. As shown in FIG. 5, by providing the converging structure 5 of a spherical structure on the surface of the optical transmitting resin on the light receiving surface of the semiconductor light receiving element 2, the surface thereof serves as a lens to converge a large amount of light on the light receiving surface of the semiconductor light receiving surface 2. The shape of the converging structure 5 (curvature, for example) is suitably determined such that the intensity of photocurrent outputted from the semiconductor light receiving element 2 achieves a desired value.

The semiconductor photodetector with such structure may be formed by providing a plurality of semiconductor light receiving elements on a converging substrate, sealing the light receiving side thereof with the optical transmitting resin of the present invention in which micro particles are dispersed and separating by cutting using a dicing blade.

Figure 6:
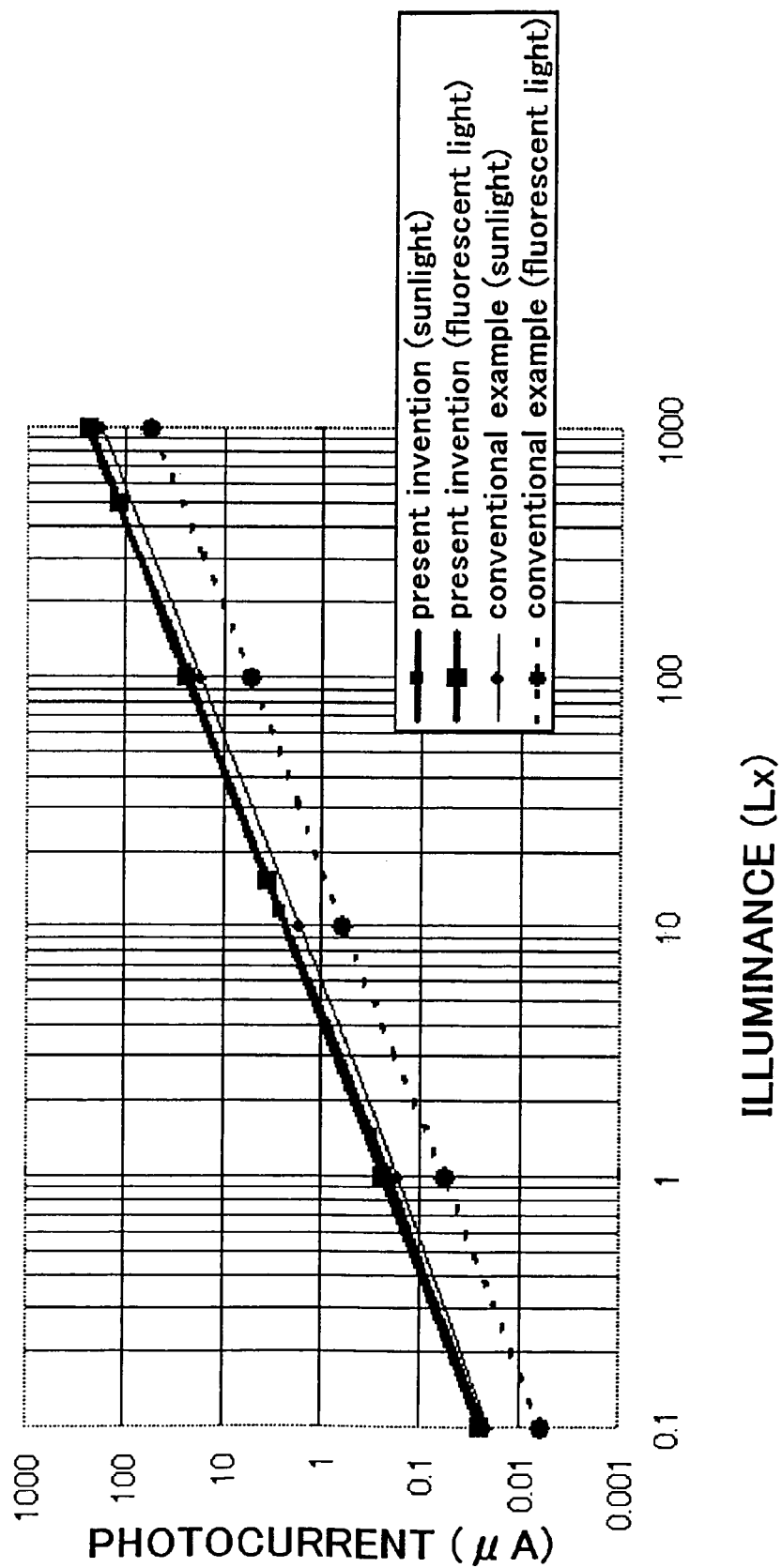
FIG. 6 is a characteristic diagram of photocurrent of the semiconductor photodetector according to Example 1 of the present invention.

A measurement result of the photocurrent outputted from the semiconductor photodetector according to the present invention is shown in FIG. 6. For the purpose of comparison, a measurement result of the photocurrent of a conventional example (a semiconductor photodetector sealed with an optical transmitting resin in which the amount of micro particles which transmits light in wavelengths in the infrared region is dispersed, to thereby obtain the photocurrent without being provided with a converging structure) is also shown. In the conventional example, photocurrent is weak for fluorescent light which does not include light in wavelengths in the infrared region whereas photocurrent is strong for sunlight which includes light in wavelengths in the infrared region. In other words, it is grasped that photocurrent is increased by light in wavelengths in the infrared region which does not correspond to the relative luminous sensitivity with respect to sunlight. On the other hand, the semiconductor photodetector of the present invention can obtain substantially corresponding photocurrent when the light source is either sunlight or fluorescent light, and it is confirmed that no photocurrent is generated by light in the wavelengths in the infrared region.

EXAMPLE 2

Figure 7:
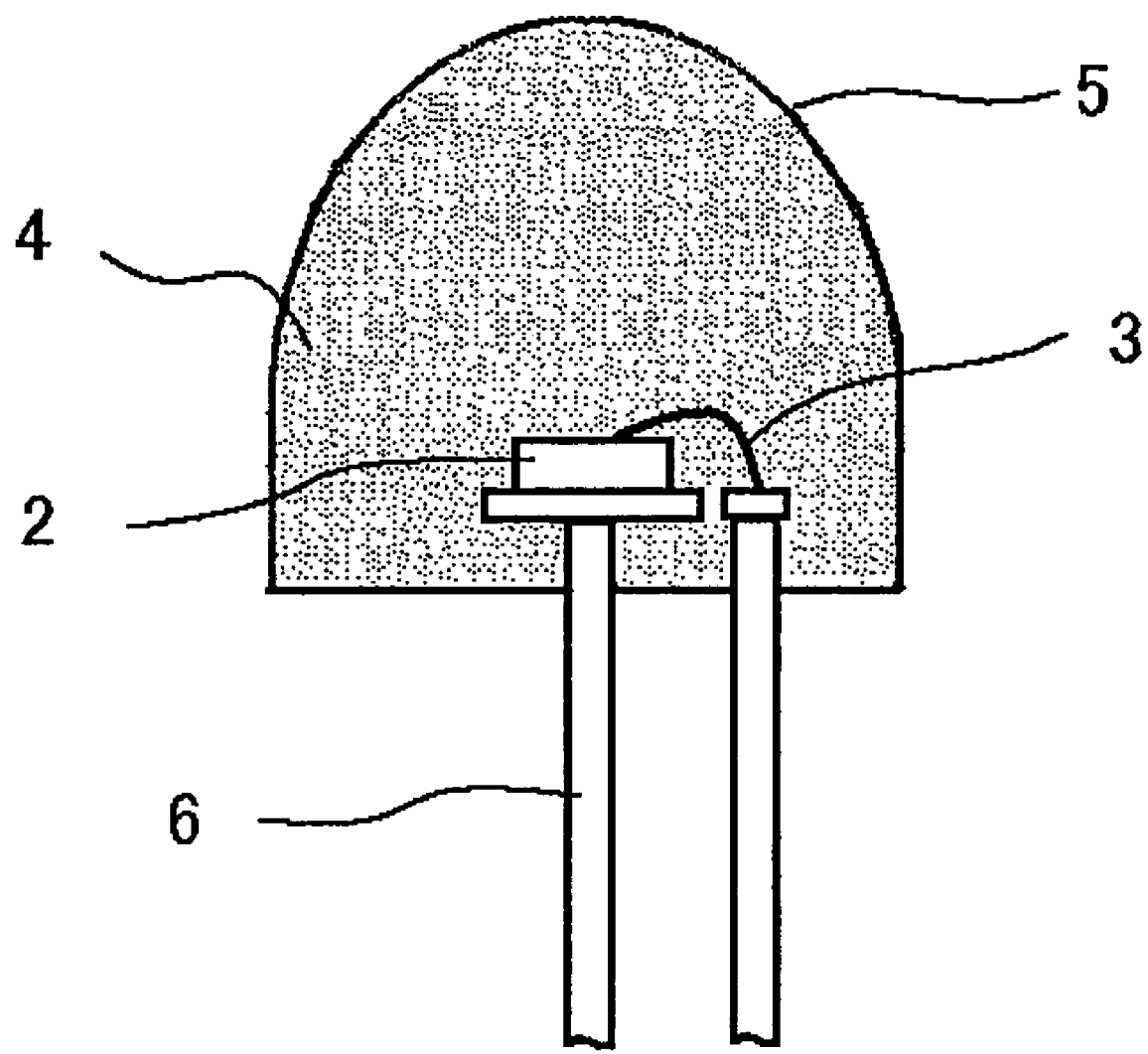
FIG. 7 is an explanatory diagram of a semiconductor photodetector according to Example 2 of the present invention.

FIG. 7 is a sectional view of another semiconductor photodetector of the present invention. In FIG. 7, numeral 2 is a semiconductor light receiving element, 3 is a metal wire, 4 is an optical transmitting resin, 5 is a converging structure and 6 is a lead. One of electrodes of the semiconductor light receiving element 2 is connected to one of leads 6, and the other electrode of the semiconductor light receiving element 2 is connected to the other lead 6 by the metal wire 3. The semiconductor photodetector has a structure which is sealed by the optical transmitting resin 4 of the present invention. In the present example, the converging structure 5 (lens structure) is formed by sealing with resin by means of a mold.

EXAMPLE 3

Figure 8:
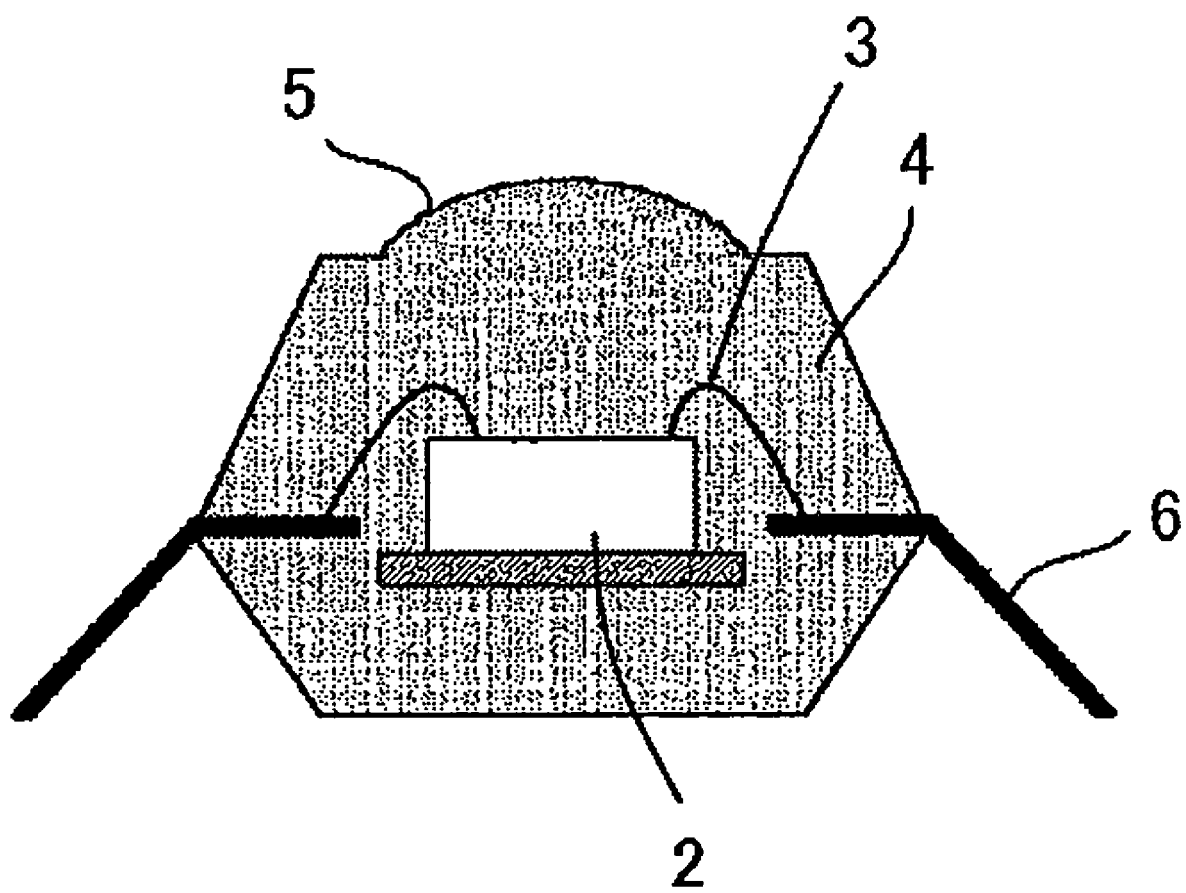
FIG. 8 is an explanatory diagram of a semiconductor photodetector according to Example 3 of the present invention.

FIG. 8 is a sectional view of further another semiconductor photodetector of the present invention. One of electrodes of the semiconductor light receiving element 2 is connected to one of leads 6 by the metal wire 3, and the other electrode of the semiconductor light receiving element 2 is connected to the other lead 6 by the metal wire 3. The semiconductor photodetector has a structure which is sealed by the optical transmitting resin 4 of the present invention. In the present example, the converging structure 5 (lens structure) is formed by sealing with resin by means of a mold.

Figure 9:
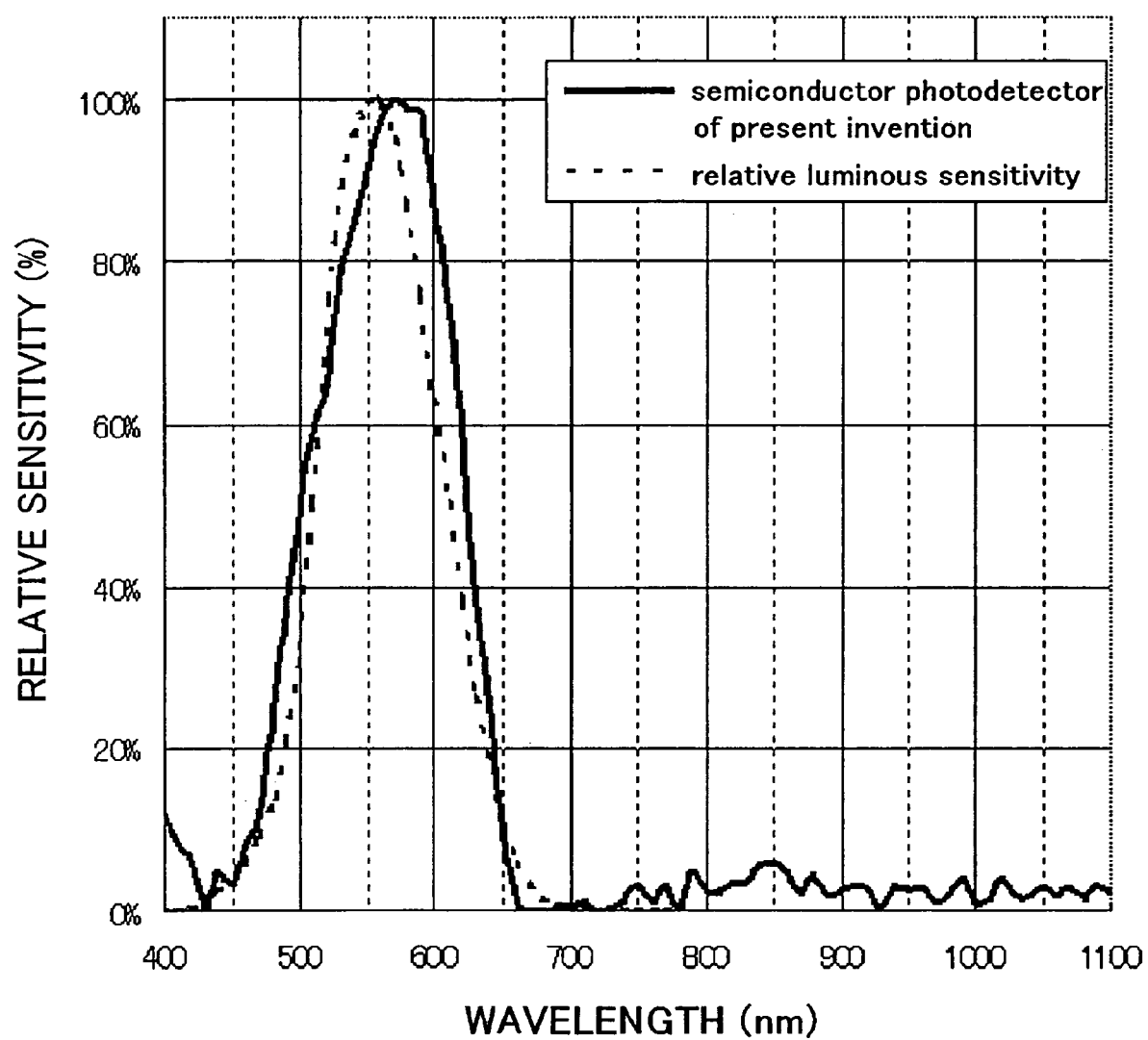
FIG. 9 is a diagram of spectral sensitivity characteristics of the semiconductor photodetector of the present invention.

One example of spectral characteristics of this formed semiconductor photodetector is shown in FIG. 9. From FIG. 9, it is confirmed that spectral characteristics substantially corresponding to relative luminous characteristics can be obtained. Such spectral characteristics can be obtained by properly determining the light receiving area of the semiconductor light receiving element, concentration of micro particles dispersed in the optical transmitting resin or thickness of the optical transmitting resin on the light receiving surface.

Examples of the present invention have been explained in above. However, the present invention is not limited to the above-mentioned examples and may be changed in various manners. For example, the converging structure may be formed by combining a well-known lens as a separate component from the semiconductor photodetector. Furthermore, in the case of forming the converging structure with the optical transmitting resin, it is not limited to use the optical transmitting resin of the present invention in which a predetermined amount of micro particles is dispersed. Instead, at least a part of the optical transmitting resin may be formed from a transparent resin or an optical transmitting resin in which not more than the predetermined amount of micro particles is dispersed (amount which can block light in the infrared region).

For example, in the case of the semiconductor photodetector explained in Example 3, it is also possible to form it by adhering the converging structure 5 formed from the transparent resin on the sealing resin on the light receiving surface of the semiconductor light receiving element by an adhesive (for example UV adhesive) which transmits light in the visible light region on top of the optical transmitting resin 4 in which micro particles are dispersed as shown in FIG. 10.

What is claimed is:

1. A semiconductor photodetector comprising a semiconductor light receiving element having spectral sensitivity in wavelengths from at least a visible light region to infrared region and an optical transmitting resin for sealing at least a light receiving surface of the semiconductor light receiving element formed from boride of one or more elements selected from La, Pr, Nd, Ce, Y, Ti, Zr, Hf, V, Nb, Ta, Cr, Mo or W or in stead of said boride, or in addition to said boride, ruthenium oxide and/or iridium oxide and in which micro particles of said boride and oxide whose particle diameter is not more than 100 nm are dispersed:
wherein said optical transmitting resin is dispersed with an amount of the micro particles by which photocurrent can be obtained through the semiconductor light receiving element by transmitting light in wavelengths in the visible light region while blocking light in wavelengths in the infrared region, and a converging structure is provided on the light receiving surface of the semiconductor light receiving element.

2. The semiconductor photodetector according to claim 1, wherein said micro particles are dispersed in the transparent resin in such a manner that relative transmissivity of light in wavelengths in the infrared region to be blocked is not more than 1.5% compared to a peak value of transmissivity of light in wavelengths in the visible light region which transmits said optical transmitting resin.

3. The semiconductor photodetector according to claim 1, wherein a concentration of said micro particles included in the transparent resin and thickness of said optical transmitting resin are determined in such a manner that relative transmissivity of light in wavelengths in the infrared region to be blocked is not more than 1.5% compared to a peak value of transmissivity of light in wavelengths in the visible right region which transmits said optical transmitting resin.

4. The semiconductor photodetector according to claim 1, wherein said micro particles are dispersed in the transparent resin in such a manner that relative transmissivity of light in wavelengths in the infrared region to be blocked is not more than 5% compared to a peak value of transmissivity of light in wavelengths in the visible light region which transmits said optical transmitting resin.

5. The semiconductor photodetector according to claim 1, wherein a concentration of said micro particles included in the transparent resin and thickness of said optical transmitting resin is determined in such a manner that relative transmissivity of light in wavelengths in the infrared region to be blocked is not more than 5% compared to a peak value of transmissivity of light in wavelengths in the visible right region which transmits said optical transmitting resin.

6. The semiconductor photodetector according to claim 1, wherein said converging structure is integrally formed with said optical transmitting resin for sealing the light receiving surface by a resin which transmits light in wavelengths in at least visible light region.

7. The semiconductor photodetector according to claim 1, wherein said converging structure is integrally formed with said optical transmitting resin for sealing the light receiving surface by the optical transmitting resin in which said micro particles are dispersed.

8. The semiconductor photodetector according to claim 2, wherein said converging structure is integrally formed with said optical transmitting resin for sealing the light receiving surface by a resin which transmits light in wavelengths in at least visible light region.

9. The semiconductor photodetector according to claim 3, wherein said converging structure is integrally formed with said optical transmitting resin for sealing the light receiving surface by a resin which transmits light in wavelengths in at least visible light region.

10. The semiconductor photodetector according to claim 4, wherein said converging structure is integrally formed with said optical transmitting resin for sealing the light receiving surface by a resin which transmits light in wavelengths in at least visible light region.

11. The semiconductor photodetector according to claim 5, wherein said converging structure is integrally formed with said optical transmitting resin for sealing the light receiving surface by a resin which transmits light in wavelengths in at least visible light region.

12. The semiconductor photodetector according to claim 2, wherein said converging structure is integrally formed with said optical transmitting resin for sealing the light receiving surface by the optical transmitting resin in which said micro particles are dispersed.

13. The semiconductor photodetector according to claim 3, wherein said converging structure is integrally formed with said optical transmitting resin for sealing the light receiving surface by the optical transmitting resin in which said micro particles are dispersed.

14. The semiconductor photodetector according to claim 4, wherein said converging structure is integrally formed with said optical transmitting resin for sealing the light receiving surface by the optical transmitting resin in which said micro particles are dispersed.

15. The semiconductor photodetector according to claim 5, wherein said converging structure is integrally formed with said optical transmitting resin for sealing the light receiving surface by the optical transmitting resin in which said micro particles are dispersed.

* * * * *